United States Patent
Shim (10) Patent No.: US 7,629,821 B2
(45) Date of Patent: Dec. 8, 2009

(54) SEMICONDUCTOR MEMORY DEVICE

(75) Inventor: Seok-Bo Shim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 28 days.

(21) Appl. No.: 11/987,834

(22) Filed: Dec. 5, 2007

(65) Prior Publication Data

US 2008/0238507 A1 Oct. 2, 2008

(30) Foreign Application Priority Data

Mar. 30, 2007 (KR) ............... 10-2007-0031972

(51) Int. Cl.
*H03L 7/06* (2006.01)
(52) U.S. Cl. .................. 327/158; 327/149
(58) Field of Classification Search .......... None
See application file for complete search history.

(56) References Cited

U.S. PATENT DOCUMENTS

| | | | |
|---|---|---|---|
| 6,242,954 B1 * | 6/2001 | Taniguchi et al. | 327/149 |
| 6,292,016 B1 * | 9/2001 | Jefferson et al. | 326/39 |
| 6,518,807 B1 * | 2/2003 | Cho | 327/158 |
| 7,099,232 B2 * | 8/2006 | Kwak | 365/194 |
| 7,138,845 B2 * | 11/2006 | Lin | 327/277 |
| 7,336,752 B2 * | 2/2008 | Vlasenko et al. | 375/376 |

FOREIGN PATENT DOCUMENTS

| | | |
|---|---|---|
| KR | 10-2003-0048657 | 6/2003 |
| KR | 10-2005-0105558 | 11/2005 |
| KR | 10-2007-0036564 | 4/2007 |
| KR | 10-0810073 | 2/2008 |
| WO | WO 2005-083716 | 9/2005 |

OTHER PUBLICATIONS

Notice of Allowance issued from Korean Intellectual Property Office on Aug. 13, 2008 with an English Translation.

* cited by examiner

*Primary Examiner*—Cassandra Cox
(74) *Attorney, Agent, or Firm*—IP & T Law Firm PLC (57) ABSTRACT

A semiconductor memory device includes a phase comparator, a delay chain, a delay controller, a fine delay chain, a delay model, a locking state detector, and a fine delay controller. The phase comparator compares a phase of a reference clock with that of a feedback clock. The delay chain delays and outputs the reference clock. The delay controller controls a delay value of the delay chain in response to the comparison result of the phase comparator. The fine delay chain outputs a delay value of a clock outputted from the delay chain. The delay model delays a clock to a modeled delay value to provide a delayed clock as the feedback clock. The locking state detector generates a locking variation signal corresponding to a phase difference between the reference clock and the feedback clock. The fine delay controller controls a fine adjustment value of the fine delay chain.

13 Claims, 7 Drawing Sheets

| P11 | P4 | P5 | P6 | P7 | P8 | P9 | P10 | P11 |
|---|---|---|---|---|---|---|---|---|
| FINE DELAY OPERATION | MARGIN | ADDITIONAL FINE DELAY OPERAITON | MARGIN | LPF CONTROL | DELAY CONTROLLER CONTROL | DELAY CHAIN CONTROL | MARGIN | FINE DELAY OPERAITON |

SEMICONDUCTOR MEMORY DEVICE

CROSS-REFERENCE TO RELATED APPLICATION

The present invention claims priority of Korean patent application number 10-2007-0031972, filed on Mar. 30, 2007, which is incorporated by reference in its entirety.

BACKGROUND OF THE INVENTION

The present invention relates to a semiconductor memory device; and, more particularly, to a delay locked loop (DLL) circuit for use in a semiconductor memory device.

In a system having a plurality of semiconductor devices that perform a variety of functions, a semiconductor memory device is a device for storing data. This semiconductor memory device outputs data corresponding to an address from a data processing device, for example, a central processing unit to a device requesting such data, or stores data transmitted from the data processing device in a unit cell of the semiconductor memory device corresponding to an address inputted along with the data.

As an operating speed of system becomes faster, a data input/output speed of a semiconductor memory device required by a data processing device provided in the system becomes faster. Moreover, due to the recent rapid advance of semiconductor integrated technology, the operating speed of the data processing device is faster, but the data input/output speed of the semiconductor memory device that communicates data with the data processing device does not follow the increasing speed of the data processing device.

In order to increase the data input/output speed of the semiconductor memory device to the level required by the data processing device, various types of semiconductor memory devices have been developed. One of the most widely used semiconductor memory devices up to now has been a synchronous memory device incorporating a data processing device therein, which allows data output every period of a system clock. Such a synchronous memory device accepts a system clock and outputs data to the data processing device corresponding to the period of the system clock inputted thereto or takes data from the data processing device every period of the system clock. However, even the synchronous memory device does not run after the operating speed of the data processing device, and thus, DDR synchronous memory device has been proposed. The DDR synchronous memory device outputs or receives data each time a system clock is transited. That is, it receives or outputs data in synchronism with each of rising transition and falling transition.

However, the system clock inputted to the memory device arrives in a data output circuit with a certain delay inevitably caused due to a clock input buffer arranged in the memory device, transmission lines for transmitting the clock signal, and the like. Thus, if the data output circuit outputs data in synchronism with the system clock that is transmitted with a certain delayed time already occurred, an external device will receive the data, which is not synchronized with the rising edge and falling edge of the system clock, outputted from the memory device.

To solve the above problem, a semiconductor memory device is provided with a DLL circuit for locking a delay of a clock signal. The DLL circuit is a circuit for compensating a value delayed by internal circuits of the memory device from input of the system clock to the memory device to its delivery to a data output circuit. This DLL serves to find a delayed time due to the clock input buffer of the semiconductor memory device, clock signal transmission lines and the like, and delays the system clock corresponding to the found value and then outputs the same to the data output circuit. In other words, by the DLL circuit, the system clock inputted to the memory device is delivered to the data output circuit in a state that the delayed value is constantly locked. Then, the data output circuit outputs the data in synchronism with the delay locked clock and it is regarded in the outside that the data is outputted precisely in synchronism with the system clock.

Actually, the delay locked clock is outputted from the DLL circuit at a given time faster than the output time of the data by one period and delivered to the output buffer, and the data is outputted in synchronism with the delay locked clock delivered. Thus, the data can be outputted rapidly by the delay of the system clock caused by the internal circuits of the memory device. By doing so, outside of the memory device, it is regarded that the data is outputted precisely in synchronism with each of the rising edge and falling edge of the system clock inputted to the memory device. As a result, the DLL circuit can effectively compensate the delayed value of the system clock caused in the memory device by finding the speed at which the data is to be outputted.

Meanwhile, the delay locked operation of the DLL circuit is divided into a normal delay locked operation and a fine delay locked operation. The normal delay locked operation is to adjust the delay locked value of the system clock depending on the number of unit delay elements through which the system clock is passed. On the other hand, the fine delay locked operation adjusts the number of unit delay elements by more finely adjusting the delayed value of the delay locked clock to the possible range.

However, there is still a need for an improved DLL circuit capable of finely adjusting a system clock depending on a change in a locking state.

SUMMARY OF THE INVENTION

Embodiments of the present invention are directed to provide a delay lock loop (DLL) capable to finely adjust a system clock in response to a locking state of the system clock.

In accordance with an aspect of the present invention, there is provided a semiconductor memory device including a phase comparator, a delay chain, a delay controller, a fine delay chain, a delay model, a locking state detector, and a fine delay controller. The phase comparator compares a phase of a reference clock with that of a feedback clock. The delay chain delays and outputs the reference clock. The delay controller controls a delay value of the delay chain in response to the comparison result of the phase comparator. The delay controller controls a delay value of the delay chain in response to the comparison result of the phase comparator. The fine delay chain finely adjusts and outputs a delay value of a clock outputted from the delay chain. The delay model delays a clock outputted from the fine delay chain to a modeled delay value to provide a delayed clock as the feedback clock. The locking state detector generates a locking variation signal corresponding to a phase difference between the reference clock and the feedback clock. The fine delay controller controls a fine adjustment value of the fine delay chain in response to an output of the delay controller and the comparison result of the phase comparator. A fine adjustment period of the fine delay chain is adjusted in response to the locking variation signal.

In accordance with another aspect of the present invention, there is provided a semiconductor memory device including a normal delay chain, a fine delay chain, a locking state detector, and a fine delay controller. The normal delay chain delays and outputs a phase of a system clock. The fine delay chain adjusts a delay value of a clock outputted from the normal delay chain to a finer value than a value adjusted by the normal delay chain. The locking state detector detects a phase variation of a delay locked clock by the normal delay chain and the fine delay chain. The fine delay controller controls a clock adjustment period of the fine delay chain based on a result detected by the locking state detector.

In accordance with further another aspect of the present invention, there is provided a driving method of a semiconductor memory device including comparing a phase of a reference clock with a phase of a feedback clock; delaying and outputting the reference clock; finely adjusting a phase of the delayed reference clock; delaying a finely adjusted reference clock to a modeled delay value to output the feedback clock; generating a locking variation signal corresponding to a phase difference between the reference clock and the feedback clock; and controlling a fine adjustment value of a fine delay chain in response to an output of the a controller and a comparison result of a phase comparator. A fine adjustment period of the fine delay chain is adjusted in response to the locking variation signal.

In accordance with still further another aspect of the present invention, there is provided a driving method of a semiconductor memory device including delaying and outputting a phase of a system clock; finely adjusting a phase of the delayed system clock to generate a delay locked clock; detecting a phase variation state of the finely adjusted clock; and controlling a fine adjustment period based on the detected phase variation state.

DETAILED DESCRIPTION OF THE INVENTION

Hereinafter, most preferred embodiments of the present invention will be described in detail with reference to the accompanying drawings so that the invention can be easily carried out by those skilled in the art.

Figure 1:
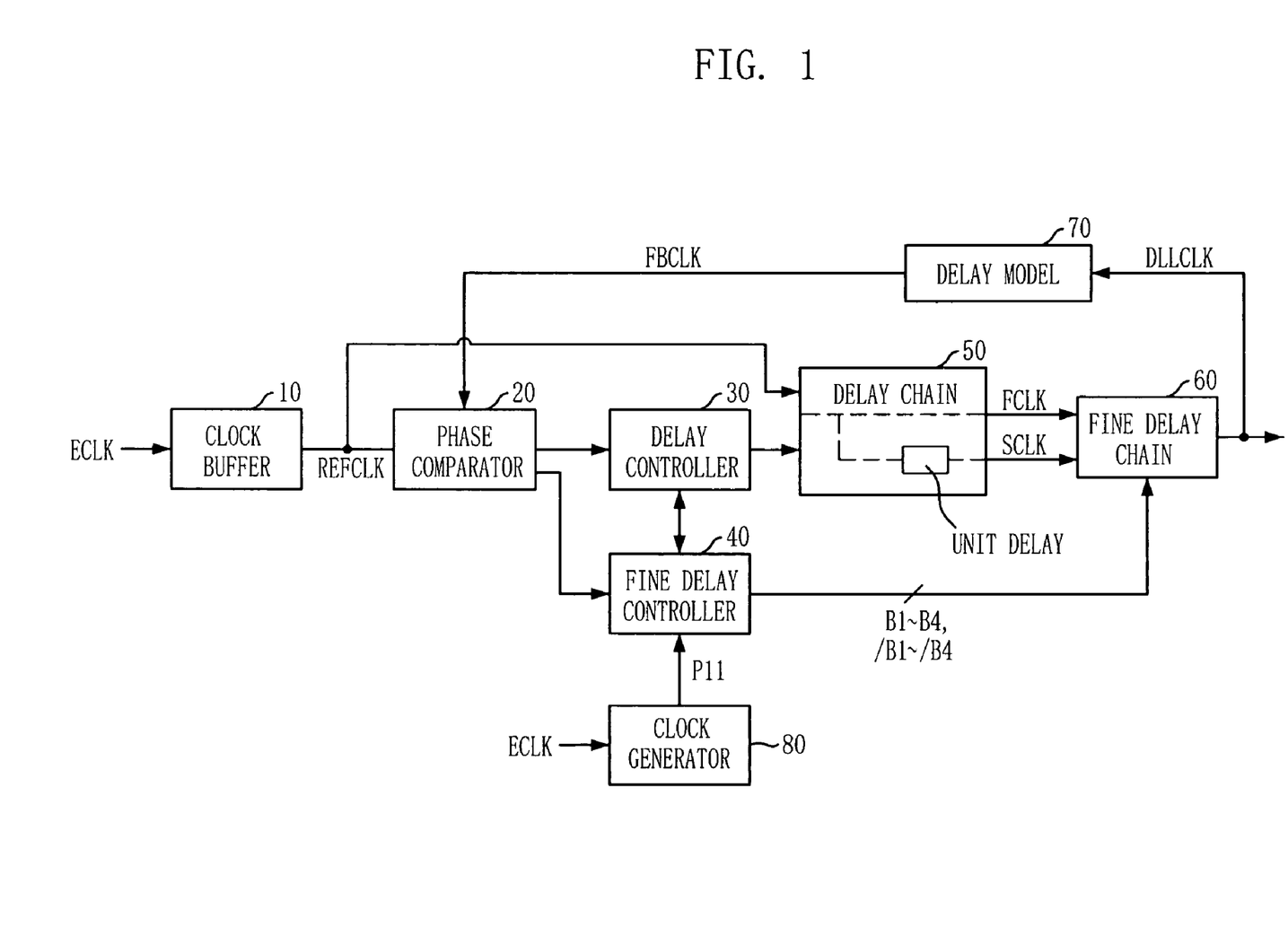
FIG. 1 is a block diagram of a semiconductor memory device.

FIG. 1 is a block diagram of a semiconductor memory device.

Referring to FIG. 1, the semiconductor memory device includes a clock buffer 10, a phase comparator 20, a delay controller 30, a fine delay controller 40, a delay chain 50, a fine delay chain 60, a delay model 70, and a clock generator 80. The clock buffer 10 receives and buffers a system clock ECLK to output a reference clock REFCLK. The phase comparator 20 compares a phase of the reference clock REFCLK with that of a feedback clock FBCLK. The delay controller 30 controls the delay chain 50 so that the delay chain 50 delays the reference clock REFCLK to a delay value corresponding to the comparison result of the phase comparator 20 to output a delayed clock. The fine delay controller 40 controls a fine adjustment operation of the fine delay chain 60 in synchronism with the period of a pulse P11 in response to the signals from the phase comparator 20 and the delay controller 30.

The delay chain 50 is provided with a plurality of unit delay elements and outputs the reference clock REFCLK after passing it through by the number of unit delay elements corresponding to the control of the delay controller 30. In particular, the delay chain 50 provides the fine delay chain 60 with a clock FCLK, which the reference clock REFCLK is delayed, along with a clock SCLK obtained by further delaying the clock FCLK by one unit delay element. The reason the clock SCLK obtained by further delaying the clock FCLK by one unit delay element is outputted along with the clock FCLK is for performing the fine delay operation in the fine delay chain 60. The fine delay chain 60 outputs a clock DLLCLK finely adjusted within a delay difference value of the two clocks FCLK and SCLK. The delay model 70 outputs the feedback clock FBCLK which is generated by delaying the clock DLLCLK outputted from the fine delay chain 60 to a modeled value. The clock generator 80 takes the system clock ECLK and generates a fine control clock P11 being clocked every fixed period. The clock P11 is a signal being clocked once each time the system clock ECLK is being clocked 11 times. The fine delay controller 40 controls the fine delay chain 60 in synchronism with the period of the fine control clock P11.

Figure 2:
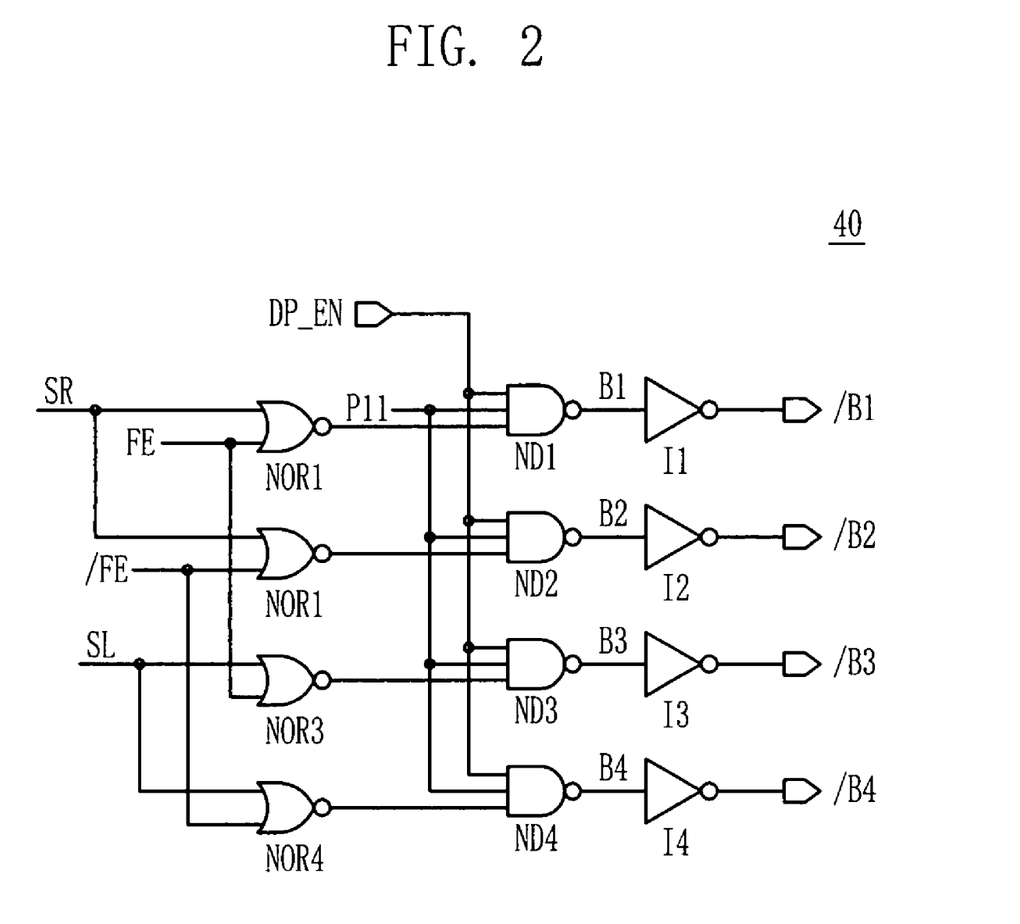
FIG. 2 is a circuit diagram of the fine delay controller of the semiconductor memory device shown in FIG. 1.

FIG. 2 is a detailed circuit diagram of the fine delay controller 40 of the semiconductor memory device shown in FIG. 1.

Referring to FIG. 2, the fine delay controller 40, which is activated by an enable signal FE provided from the delay controller 30, takes and decodes a left shift signal SL and a right shift signal SR from the phase comparator 20 and generates decoded signals B1 to B4 and /B1 to /B4 corresponding to the period of the fine control clock P11. For this, the fine delay controller 40 is provided with NOR gates NOR1 to NOR4, NAND gates ND1 to ND4, and inverters I1 to I4.

Figure 3:
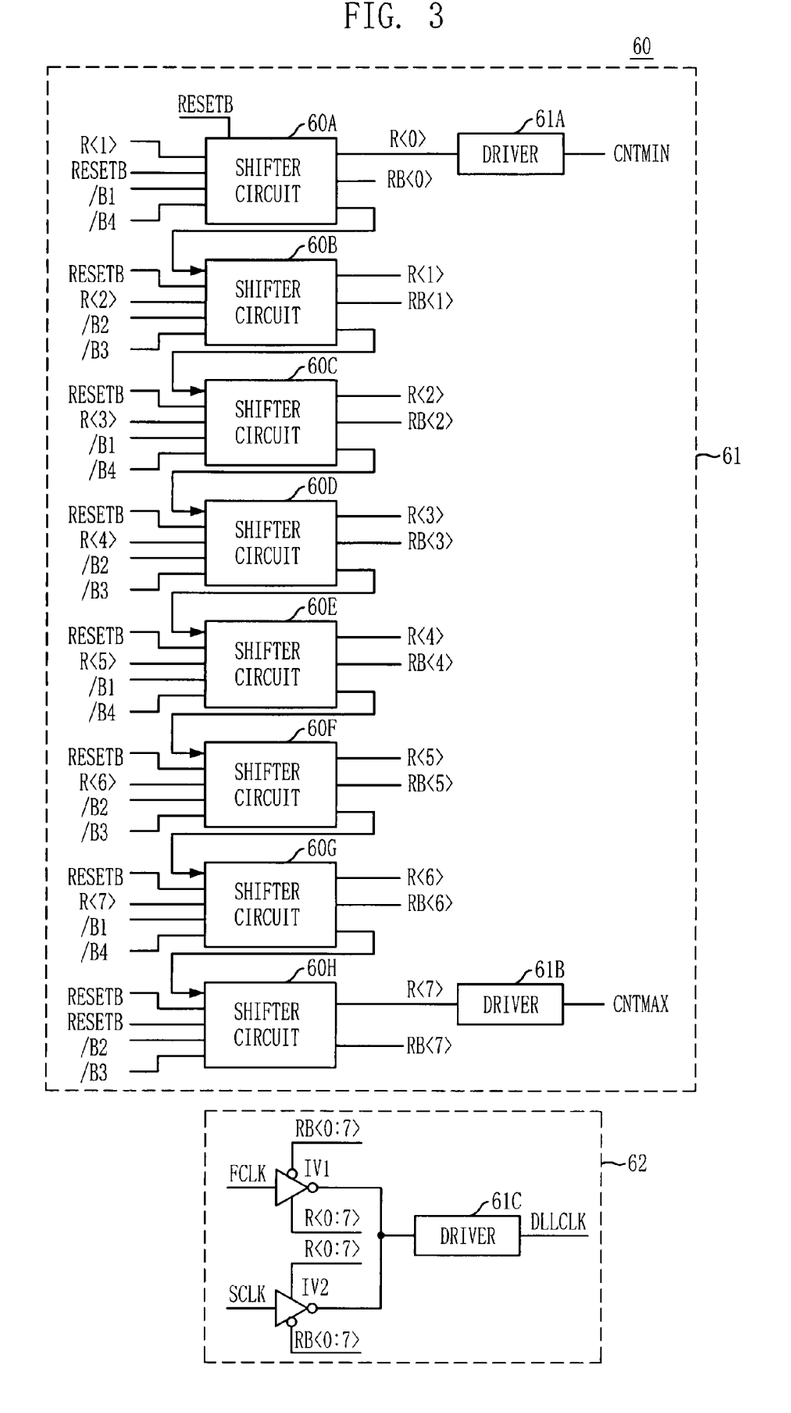
FIG. 3 is a detailed circuit diagram of the fine delay chain shown in FIG. 1.

FIG. 3 is a detailed circuit diagram of the fine delay chain 60 shown in FIG. 1.

As shown in FIG. 3, the fine delay chain 60 is provided with a fine adjustment signal generator 61 for generating fine adjustment signals R<1:7> depending on the decoded signals B1 to B4 and /B1 to /B4, and a fine adjustor 62 for producing a delay locked clock DLLCLK by using two clocks FCLK and SCLK from the delay chain 50 in response to the fine adjustment signals R<1:7>. The fine adjustment signal generator 61 is composed of a plurality of shifter circuits 60A to 60H coupled in series, which output their respective corresponding fine adjustment signals R<1:7>. The fine adjustor 62 is composed of an inverter IV1 for taking the clock FCLK and an inverter IV2 coupled in parallel therewith for receiving the clock SCLK. Each of inverters IV1 and IV2 is enabled by the corresponding one of the fine adjustment signals R<1:7>. Thus, in the fine adjustor 62, the number of inverters turned on is determined depending on the number of the fine adjustment signals R<1:7> activated. According to this, the phases of the two clocks are combined to output the delayed locked clock DLLCLK. Drivers 61A, 61B, and 61C are circuits to compensate the attenuation at the time of signal transmission. Detecting signals CNTMIN and CNTMAX are signals for detecting a deviation from the range within which the fine delay chain 60 can finely adjust. When the detection signals CNTMIN and CNTMAX are activated, the fine delay chain no longer corrects the delay value of the delay locked clock DLLCLK corresponding to the phase difference of the two clocks REFCLK and FBCLK and instead the delay chain 500 corrects the delay value.

The semiconductor memory device that performs the delay locked loop as above first determines a delay locked value of the system clock by using the delay controller 30 and the delay chain 50 to output the clock corresponding thereto to the fine delay chain. This state is generally referred to as a lock state. Thereafter, the delay locked clock is finely adjusted within the delay value corresponding to one unit delay of the delay chain by the fine delay controller 40 and the fine delay chain 60. In this procedure, the fine delay controller 40 controls the fine delay chain 50 so that the fine delay chain 50 can perform the fine adjustment operation in synchronism with timing at which the fine control clock P11 is being clocked. Thus, since the fine control clock P11 is a clock that is being clocked once every 11 periods of the system clock, the fine adjustment operation is done once every 11 periods of the system clock. In case a fine delay amount, which the fine delay chain 60 can adjust the delay value of the delay locked clock DLLCLK corresponding to the phase difference of the two clocks FBCLK and REFCLK once, is about 20 ps, if the phase difference of the two clocks FBCLK and REFCLK is about 100 to 150 ps, about 5 to 7 periods of the fine control clock P11 are required to adjust this. That is, 55 to 77 periods of the system clock are needed.

If there is some phase difference between the reference clock REFCLK and the feedback clock FBCLK due to a level change of a power supply voltage from outside after being in a locking state since there is no phase difference between the reference clock REFCLK and the feedback clock FBCLK, only the fine delay controller 40 and the fine delay chain 60 have to correct the phase difference of the two clocks FBCLK and REFCLK. Thus, in order to correct the phase difference of the two clocks FBCLK and REFCLK, a large number of periods of the system clock are required. In other words, much time is taken to correct the phase of the delay locked clock, deviating in the locking state due to ambient environments such as a power supply voltage, etc., to the original position.

To solve the above problem, the present invention proposes a semiconductor memory device in which a clock generator generates fine control clocks with various periods and a fine delay controller can control the operating period of the fine adjustment operation of a fine delay chain corresponding to the phase difference of the two clocks FBCLK and REFCLK.

Figure 4:
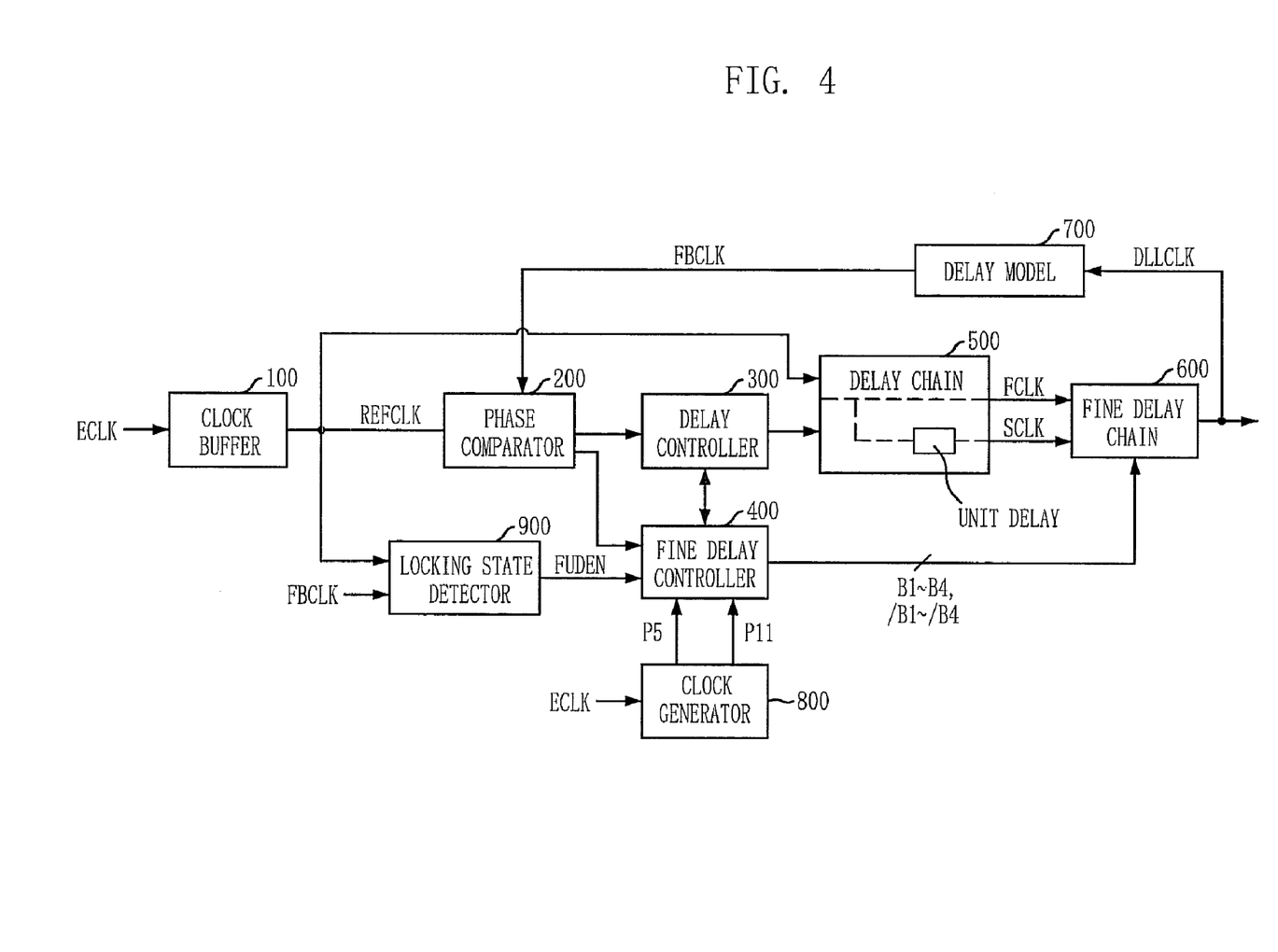
FIG. 4 is a block diagram of a semiconductor memory device in accordance with a preferred embodiment of the present invention.

FIG. 4 is a block diagram of a semiconductor memory device in accordance with a preferred embodiment of the present invention.

Referring to FIG. 4, the semiconductor memory device in accordance with this embodiment includes a clock buffer 100, a phase comparator 200, a delay controller 300, a fine delay controller 400, a delay chain 500, a fine delay chain 600, a delay model 700, and a clock generator 800. The semiconductor memory device shown in FIG. 4 is characterized by further including a locking state detector 400 and in that the fine delay controller 400 and the clock generator 800 are different in operation from those shown in FIG. 1.

The locking state detector 900 detects a phase difference between a reference clock REFCLK and a feedback clock FBCLK, and activates and outputs a detection signal FUDEN if a detected phase difference exceeds a predetermined interval. When the detection signal FUDEN is activated, the fine delay controller 400 controls the fine delay chain 600 so that it performs the fine adjustment operation at the period of a fine control clock P5. When the detection signal FUDEN is maintained in a deactivation state, the fine delay controller 400 controls the fine delay chain 600 so that it carries out the fine adjustment operation under the period of the fine control clock P11. The fine control clock P5 is characterized by being shorter in period than the fine control clock P11. For example, the fine control clock P5 may be created as a signal being clocked every 5 periods of the system clock ECLK, and the fine control clock P11 may be produced as a signal being clocked every 11 periods of the system clock ECLK.

Like this, by controlling the fine delay operation of the fine delay chain in synchronism with the period of the fine control clock P5 by the fine delay controller 400 in response to the activation state of the detection signal FUDEN, update time of the fine delay operation can be faster by about two times than the case of controlling it in response to the fine control clock P11.

Figure 5:
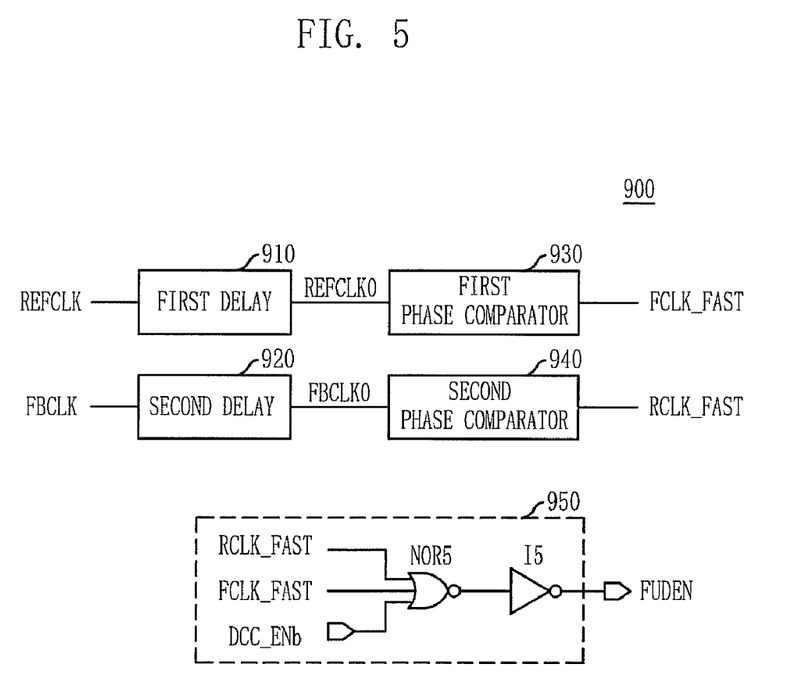
FIG. 5 is a detailed block diagram of the locking state detector shown in FIG. 4.

FIG. 5 is a detailed block diagram of the locking state detector 900 shown in FIG. 4.

As illustrated in FIG. 5, the locking state detector 900 is provided with a first delay element 910 for delaying and outputting a reference clock REFCLK by a unit delay time, a second delay element 920 for delaying and outputting a feedback clock FBCLK by a unit delay time, a first phase comparator 930 for comparing an output of the first delay element 910 with the phase of the feedback clock FBCLK, a second phase comparator 940 for comparing an output of the second delay element 920 with the phase of the reference clock REFCLK, and a logic combining circuit 950 for logically combining an output of the first phase comparator 930 and an output of the second phase comparator 940 to output locking variation signals FCLK_FAST and RCLK_FAST. The locking variation signal FCLK_FAST is a signal for detecting a case where the phase of the reference clock REFCLK is faster than that of the feedback clock FBCLK, and the locking variation signal RCLK_FAST is a signal for detecting a case where the phase of the feedback clock FBCLK is faster than that of the reference clock REFCLK. The logic combining circuit 950 is activated in response to an enable signal DCC_ENb, and outputs the locking variation signal FCLK_FAST or RCLK_FAST as a locking detection signal FUDEN. The values delayed by the first delay element 910 and the second delay element 920 can be adjusted properly and are determined depending on whether the locking detection signal FUDEN is to be activated at some phase difference between the reference clock REFCLK and the feedback clock FBCLK, and then to be outputted. As mentioned above, the fine delay controller 400 controls the fine adjustment operation of the fine delay chain 600 in response to the fine control clock P11 depending on whether the locking detection signal FUDEN is enabled. Alternatively, it may control the fine adjustment operation of the fine delay chain 600 by selecting any one of the fine control clock P11 and the fine control clock P5.

Figure 6:
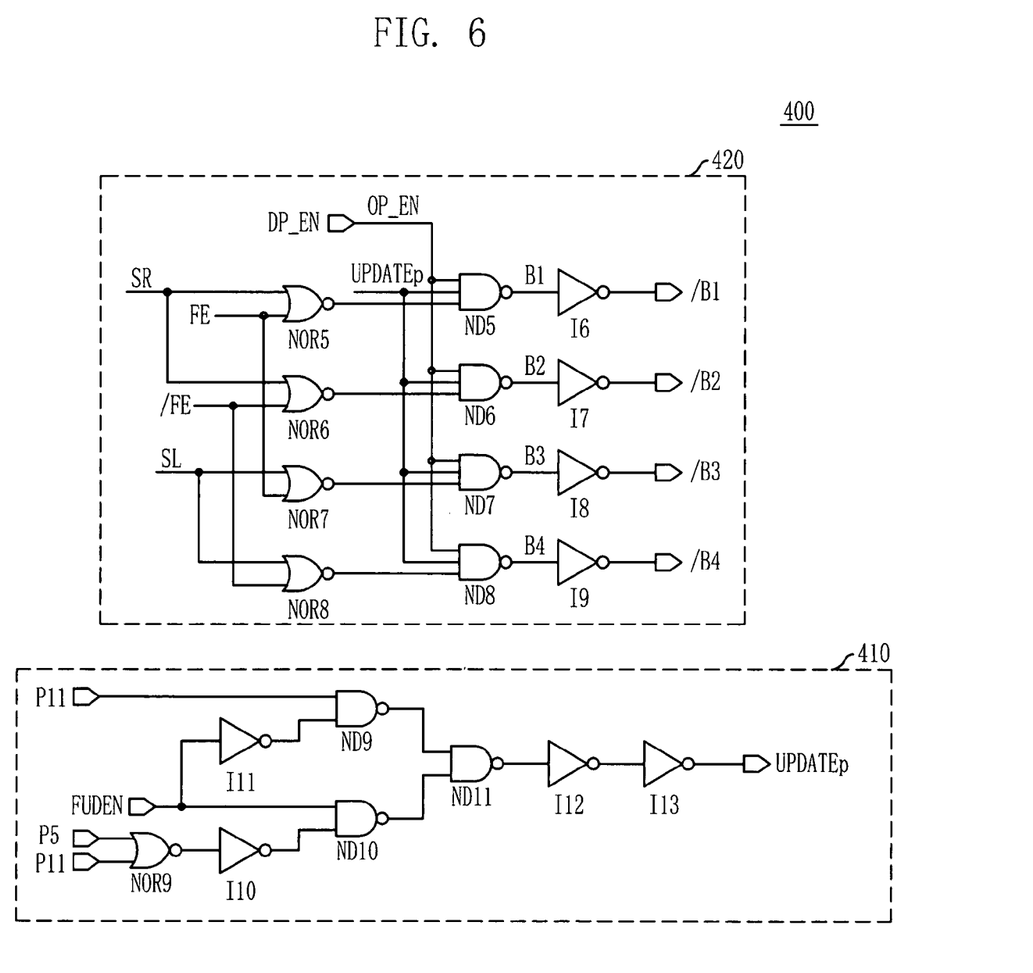
FIG. 6 is a detailed circuit diagram of the fine delay controller shown in FIG. 4.

FIG. 6 is a detailed circuit diagram of the fine delay controller 400 shown in FIG. 4.

Referring to FIG. 6, the fine delay controller 400 is provided with an update signal generator 420 for generating, in response to the locking variation signal FUDEN, an update signal UPDATEp by using the first fine control clock P11 or by using both the first fine control clock P11 and the second fine control clock P5, and a fine control signal delivery circuit 410 for providing control signals B1 to B4 and /B1 to /B4 for controlling the fine delay chain 600 thereto in response to the update signal UPDATEp. In particular, an enable signal FE is an enable signal of the fine delay controller 400 provided by the delay controller 300, and the control signals B1 to B4 and /B1 to /B4 are obtained by decoding a left shift signal SL and a right shift signal SR. For this, the fine delay controller 400 is provided with NOR gates NOR5 to NOR8, NAND gates ND5 to ND8, and inverters I6 to I9.

Figure 7:
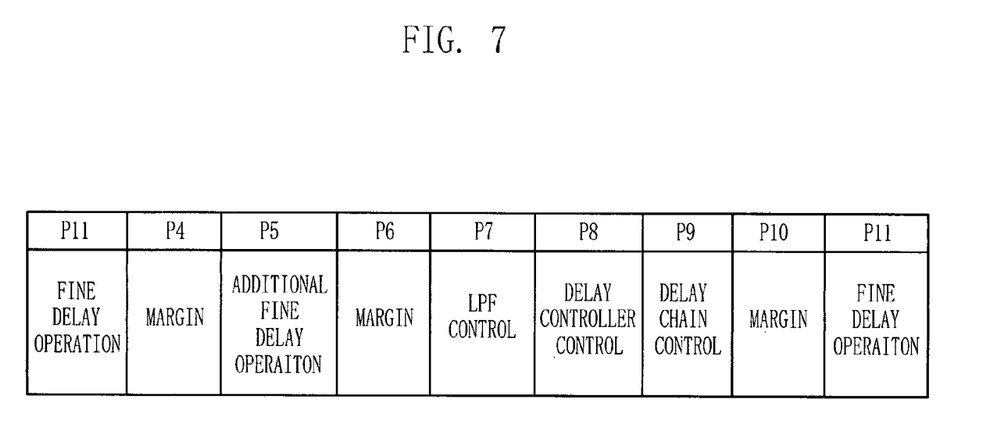
FIG. 7 is a table representing clocks outputted from the clock generator of the semiconductor memory device depicted in FIG. 4.

FIG. 7 is a table representing clocks provided from the clock generator 800 of the semiconductor memory device depicted in FIG. 4. That is, FIG. 7 describes the use of control clocks P5 to P11 generated and outputted from the clock generator 800. Although there are only the control clocks P5 and P11 in FIG. 4, the clock generator 800 generates a variety of clocks being clocked in synchronism with diverse periods of the system clock, as shown in FIG. 7. At this time, the use of each control clock is set as shown in FIG. 7, in which the control clocks P11 and P5 are for updating of the fine delay chain for fine adjustment, the control clock P7 is to control the operation of a low pass filter prepared for low pass filtering of the signal outputted from the phase comparator 200 although not shown in FIG. 4. And, the control clock P8 is to control the operation of the delay controller 300, the control clock P9 is to control the operation of the delay chain 500, and the control clocks P4 and P6 are extra control clocks for other controls.

As described above, by controlling the fine delay operation of a delay locked clock according to the present invention, the fine delay operation can be rapidly performed although there is a change in phase of the delay locked clock due to a variation of a power supply voltage level provided from outside in a locking state. As a result, the phase of the original delay locked clock can be readily recovered, and thus, the operation of a semiconductor memory device is insensitive even when there is a variation of a power supply voltage level.

In addition, the signals generated in response to the delay locked clock, for example, a data strobe signal can be improved in reliability of clocking timing.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a phase comparator for comparing a phase of a reference clock with that of a feedback clock;
   a delay chain for delaying the reference clock to output a delayed version of the reference clock;
   a delay controller for controlling a delay value of the delay chain in response to a comparison result of the phase comparator;
   a fine delay chain for finely adjusting the delayed version of the reference clock and outputting a finely delayed version of the reference clock;
   a delay model for delaying the finely delayed version of the reference clock outputted from the fine delay chain by a modeled delay value to provide a delayed clock as the feedback clock;
   a locking state detector for generating a locking variation signal corresponding to a phase difference between the reference clock and the feedback clock; and
   a fine delay controller for controlling a fine adjustment value of the fine delay chain in response to an output of the delay controller and the comparison result of the phase comparator, wherein a fine adjustment period of the fine delay chain is adjusted in response to the locking variation signal.

2. The semiconductor memory device of claim 1, further comprising a clock generator for generating a first control clock with a first period and a second control clock with a second period shorter than the first period, wherein the fine delay controller controls the fine delay chain depending on the period of the first control clock or the periods of both the first control clock and the second control clock.

3. The semiconductor memory device of claim 2, wherein the locking state detector includes:
   a first delay element for delaying the reference clock by a unit delay time to output a first delay version of the reference clock;
   a second delay element for delaying the feedback clock by a unit delay time to output a delayed version of the feedback clock;
   a first phase comparator for comparing the first delayed version of the reference clock with a phase of the feedback clock;
   a second phase comparator for comparing the delayed version of the feedback clock with a phase of the reference clock; and
   a logic combining circuit for logically combining an output of the first phase comparator and an output of the second phase comparator to output the locking variation signal.

4. The semiconductor memory device of claim 3, wherein the fine delay controller includes:
   an update signal generator for generating, in response to the locking variation signal, an update signal by using the first control clock or by using both the first control clock and the second control clock; and
   a fine control signal delivery circuit for providing a control signal for controlling the fine delay chain to the fine delay chain in response to the update signal.

5. A semiconductor memory device comprising:
   a normal delay chain for delaying and outputting a phase of a system clock;
   a fine delay chain for adjusting a delay value of a clock outputted from the normal delay chain to a finer value than a value adjusted by the normal delay chain;
   a locking state detector for detecting a phase variation of a delay locked clock delayed by the normal delay chain and the fine delay chain; and
   a fine delay controller for controlling a clock adjustment period of the fine delay chain based on a result detected by the locking state detector.

6. The semiconductor memory device of claim 5, further comprising a clock generator for generating a first control clock with a first period and a second control clock with a second period shorter than the first period,
   wherein the fine delay controller controls the fine delay chain based on the period of the first control clock or the periods of both the first control clock and the second control clock.

7. The semiconductor memory device of claim 6, wherein the fine delay controller includes:
   an update signal generator for generating, in response to a lock variation signal, an update signal by using the first control clock or by using both the first control clock and the second control clock; and
   a fine control signal delivery circuit for providing a control signal for controlling the fine delay chain to the fine delay chain in response to the update signal.

8. A driving method of a semiconductor memory device, comprising:
   comparing a phase of a reference clock with a phase of a feedback clock;
   delaying the reference clock to output a delayed version of the reference clock;
   finely adjusting a phase of the delayed version of the reference clock;

delaying a finely adjusted delayed version of the reference clock by a modeled delay value to output the feedback clock;

generating a locking variation signal corresponding to a phase difference between the reference clock and the feedback clock; and controlling a fine adjustment value of a fine delay chain in response to an output of a delay controller and a comparison result of a phase comparator, wherein a fine adjustment period of the fine delay chain is adjusted in response to the locking variation signal.

9. The driving method of claim 8, further comprising generating a first control clock with a first period and a second control clock with a second period shorter than the first period, wherein the fine adjustment period is controlled in response to the first control clock and the second control clock.

10. The driving method of claim 9, wherein the controlling of the fine adjustment value of the fine delay chain includes:

delaying an update signal by using the first control clock or by using both the first control clock and the second control clock in response to a locking variation signal to output as delayed version of the update signal; and controlling the fine adjustment period in response to the delayed version of the update signal.

11. A driving method of a semiconductor memory device, comprising the steps of:

delaying a phase of a system clock to output a delayed version of the system clock;

finely adjusting a phase of the delayed system clock to generate a delay locked clock;

detecting a phase variation state of the finely adjusted delayed version of the system clock; and controlling a fine adjustment period based on the detected phase variation state.

12. The driving method of claim 11, further comprising generating a first control clock with a first period and a second control clock with a second period shorter than the first period, wherein the fine adjustment period is adjusted in response to the first control clock or the second control clock.

13. The driving method of claim 12, wherein the controlling of the fine adjustment period includes:

generating an update signal by using the first control clock or by using both the first control clock and the second control clock in response to the detected phase variation state; and controlling the fine adjustment period in response to the update signal.

* * * * *